US012075678B2

(12) United States Patent
Liu et al.

(10) Patent No.: US 12,075,678 B2
(45) Date of Patent: Aug. 27, 2024

(54) PIXEL STRUCTURES, MASK PLATES, AND DISPLAY PANELS

(71) Applicant: YUNGU (GU'AN) TECHNOLOGY CO., LTD., Hebei (CN)

(72) Inventors: Yuxuan Liu, Jiangsu (CN); Dong Zhao, Jiangsu (CN); Xiaopeng Lv, Jiangsu (CN); Mingxing Liu, Jiangsu (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 418 days.

(21) Appl. No.: 17/398,690

(22) Filed: Aug. 10, 2021

(65) Prior Publication Data

US 2021/0384270 A1    Dec. 9, 2021

Related U.S. Application Data

(63) Continuation of application No. PCT/CN2020/086828, filed on Apr. 24, 2020.

(30) Foreign Application Priority Data

Jun. 28, 2019  (CN) .......................... 201910573766.1

(51) Int. Cl.
*H10K 59/35* (2023.01)
*H10K 59/122* (2023.01)
*H10K 59/65* (2023.01)
*G06V 40/13* (2022.01)

(52) U.S. Cl.
CPC ......... *H10K 59/353* (2023.02); *H10K 59/122* (2023.02); *H10K 59/352* (2023.02); *H10K 59/65* (2023.02); *G06V 40/1318* (2022.01)

(58) Field of Classification Search
CPC ....... H10K 59/351–353; H10K 59/122; H10K 59/65; G06V 40/1318
See application file for complete search history.

(56) References Cited

U.S. PATENT DOCUMENTS 9,312,312 B1 * 4/2016 Tsai .................... H10K 59/121
2011/0260952 A1   10/2011 Hwang et al.
2013/0234917 A1   9/2013 Lee
(Continued)

FOREIGN PATENT DOCUMENTS

CN       103311266 A    9/2013
CN       103681754 A    3/2014
(Continued)

OTHER PUBLICATIONS

Chinese 3rd Office Acton, dated Nov. 3, 2021. CN Application No. 201910573766.1.
(Continued)

*Primary Examiner* — Eric K Ashbahian
(74) *Attorney, Agent, or Firm* — Quarles & Brady LLP

(57) ABSTRACT

The present application relates to a pixel structure, a mask plate and a display panel. The pixel structure includes a plurality of repeating units arranged repetitively. Each of the repeating units includes a first sub-pixel, a second sub-pixel, and a third sub-pixel in different colors. Virtual edges of two adjacent sub-pixels in same color of adjacent repeating units are spaced apart from each other and form a transmitting region.

20 Claims, 6 Drawing Sheets

(56) References Cited

U.S. PATENT DOCUMENTS

| | | | |
|---|---|---|---|
| 2017/0200778 A1* | 7/2017 | Jeon | H10K 50/805 |
| 2017/0317150 A1 | 11/2017 | Chung et al. | |
| 2018/0175121 A1 | 6/2018 | Ji et al. | |
| 2019/0180073 A1 | 6/2019 | Zhang et al. | |
| 2019/0214596 A1* | 7/2019 | Park | H10K 77/111 |
| 2020/0027942 A1* | 1/2020 | Kodama | H10K 59/30 |
| 2020/0176522 A1 | 6/2020 | Zhao et al. | |
| 2020/0194730 A1* | 6/2020 | Park | H10K 50/822 |
| 2020/0258441 A1 | 8/2020 | Zhang et al. | |
| 2020/0357864 A1 | 11/2020 | Xiao et al. | |

FOREIGN PATENT DOCUMENTS

| | | |
|---|---|---|
| CN | 204332961 U | 5/2015 |
| CN | 104835832 A | 8/2015 |
| CN | 107342039 A | 11/2017 |
| CN | 107968103 A | 4/2018 |
| CN | 107994034 A | 5/2018 |
| CN | 108666348 A | 10/2018 |
| CN | 109037287 A | 12/2018 |
| CN | 208507679 U | 2/2019 |
| CN | 109411519 A | 3/2019 |
| CN | 109585508 A | 4/2019 |
| CN | 109585508 A | 4/2019 |
| CN | 208737490 U | 4/2019 |
| CN | 208753326 U | 4/2019 |
| CN | 109817665 A | 5/2019 |
| CN | 110323259 A | 10/2019 |
| CN | 107680990 A | 5/2020 |
| EP | 2709155 A1 | 3/2014 |

OTHER PUBLICATIONS

International Search Report and Written Opinion (International Application No. PCT/CN2020/086828) with English Translation, dated Jul. 22, 2020, 14 pages.

Chinese First Office Action 100191 (CN Application No. CN 201910573766.1) and Search Report with English Translation, dated Mar. 3, 2021, 21 pages.

Chinese Second Office Action 100191 (CN Application No. CN 201910573766.1) with English Translation, dated Mar. 3, 2021, 23 pages.

* cited by examiner

PIXEL STRUCTURES, MASK PLATES, AND DISPLAY PANELS

CROSS-REFERENCE TO RELATED APPLICATIONS

This application is a continuation of international patent application No. PCT/CN2020/086828, filed on Apr. 24, 2020, which claims the benefit of Chinese Patent Application No. 201910573766.1, filed on Jun. 28, 2019. The contents of both applications are also hereby incorporated by reference in their entireties.

TECHNICAL FIELD

The present application relates to the field of display technology.

BACKGROUND

With the development of display technology, the demand for high-resolution display panels is increasing. Due to the advantages such as the high display quality, the high-resolution display panels are becoming widely used in many fields. Generally, the resolution of the display panel can be increased by reducing the sizes of the display pixels and the intervals among the pixels. However, the smaller the pixel sizes and the intervals, the higher the accuracy required in the manufacturing process of the display panel, and the higher the manufacturing difficulty and cost.

SUMMARY

In view of this, there is a need to provide a pixel structure, a mask plate, and a display panel.

The present application provides a pixel structure including a plurality of repetitively arranged repeating units. Each of the repeating units includes a first sub-pixel, a second sub-pixel, and a third sub-pixel in different colors.

Virtual edges of two adjacent sub-pixels in the same color of adjacent repeating units are spaced apart from each other and form a transmitting region.

In the above-described pixel structure, the virtual edges of the two adjacent sub-pixels in the same color of adjacent repeating units are spaced apart from each other and form the transmitting area, so that the light transmittance of the pixel structure can be increased, and, therefore, the amount of lights received by a photosensitive device (such as a fingerprint identification device) can be increased, thereby improving the identification accuracy of the photosensitive device and the imaging efficiency.

The present application also provides a mask plate used in manufacturing the above-described pixel structure. The mask plate includes a plurality of mask openings.

The present application also provides a display panel, which includes a substrate, a photosensitive device, and the above-described pixel structure. The pixel structure and the photosensitive device are disposed on opposite sides of the substrate.

DETAILED DESCRIPTION OF THE EMBODIMENTS

Figure 1:
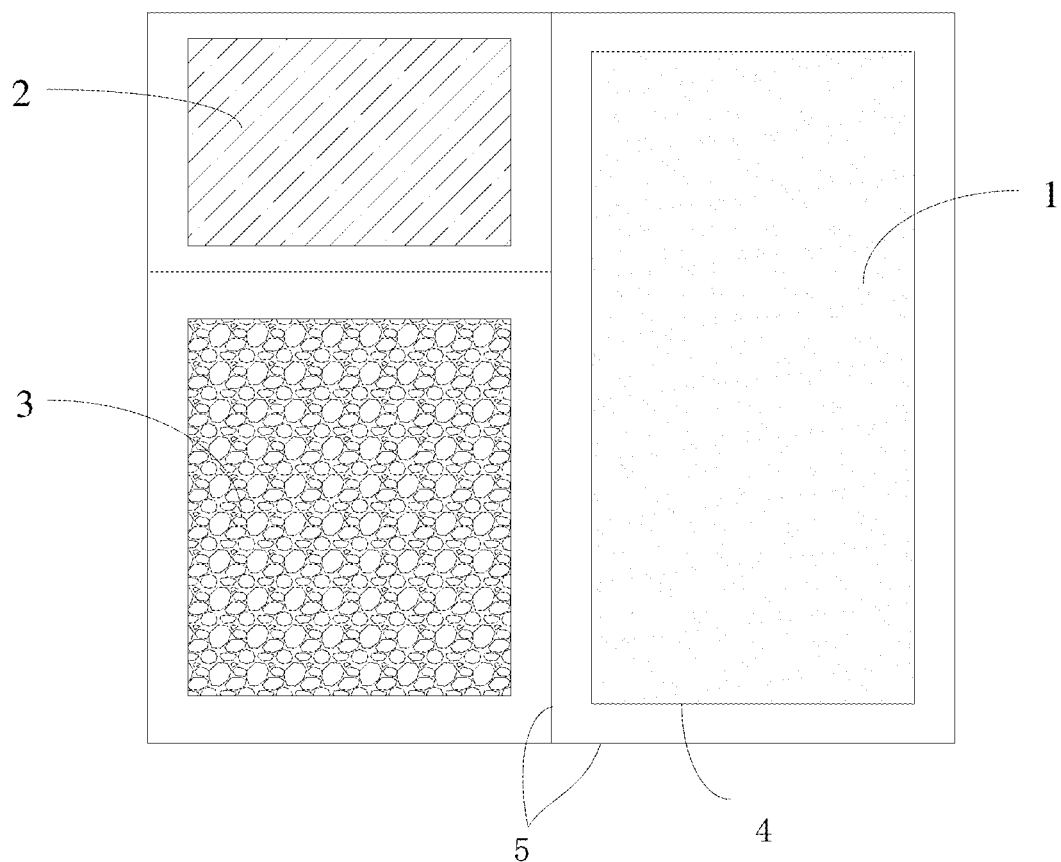
FIG. 1 is a schematic view of a pixel structure.

In order to facilitate understanding of the present application, the present application will be described in detail below with reference to the related drawings. Some embodiments of the present application are shown in the drawings. However, the present application can be implemented in many different forms and not be limited to the embodiments described herein. Rather, the purpose of providing these embodiments is to provide a thorough understanding of the present application.

For the display panel with a fingerprint identification function, in order to realize a full-screen display and prevent a fingerprint identification region from occupying a non-displaying region, a displaying region also functions as the fingerprint identification region in an under-screen fingerprint identification technology. However, under-screen fingerprint identification has a relatively low accuracy for identifying ridges and valleys of a fingerprint, which further affects the accuracy of the fingerprint identification.

Fingerprint identification technology is one of the most widely used biometric technologies. At present, most of the fingerprint identification sensors of smart devices are embedded in the home keys or the backs of the device bodies, and, therefore, independent physical buttons are required, which hinders the development of the display devices with high screen-to-body ratios. In order to address this problem, an under-screen fingerprint identification technology has been developed. A fingerprint identification sensor can include an image sensor configured to capture a fingerprint image. The image sensor includes a plurality of photosensitive units capable of converting incident lights into electrical signals which form image pixels. In the under-screen fingerprint identification technology, the image sensor is disposed under a display panel, and the amount of lights that the display panel allows to pass therethrough will therefore affect the intensity and contrast of light signals received by the image sensor, and will further affect the detection for the fingerprint image.

As shown in FIG. 1, a pixel structure of each pixel unit of a display panel includes three sub-pixels 1, 2, and 3 in different colors. Each sub-pixel has a rectangular shape. The edge of the inner rectangle is a pixel edge 4 which is a boundary of a pixel defining opening of a pixel defining layer (PDL). The edge of the outer rectangle is a virtual edge 5 of the sub-pixel. The regions between the pixel edges 4 and the virtual edges 5 are the intervals between the pixel defining openings. For example, pillars can be disposed at the positions of the intervals and configured to support a mask plate in the manufacturing of the display panel. Therefore, the larger the sizes of the intervals, the smaller the light-emitting areas of the sub-pixels, the smaller the pixel aperture ratio, and the smaller the pixels per inch (PPI) of the display panel.

The inventor has found that light-impermeable films or layers can exist in all of the light-emitting layer, the electrode layer, and the driving layer of each pixel in the display panel. The higher the PPI of the display panel, the lower the overall light transmittance thereof. Therefore, in the related art, to realize a relatively high resolution, the display panel cannot have enough transmitting area, and therefore it is difficult for the fingerprint identification function of the display device to meet the requirements in practical use.

The present application provides embodiments of a pixel structure, a mask plate, and a display panel to solve the above-mentioned problems, enabling the display panel to have a relatively high resolution while reducing the difficulties in manufacturing the mask plate and in the evaporating process, and improving the light transmittance of the display panel.

Figure 2:
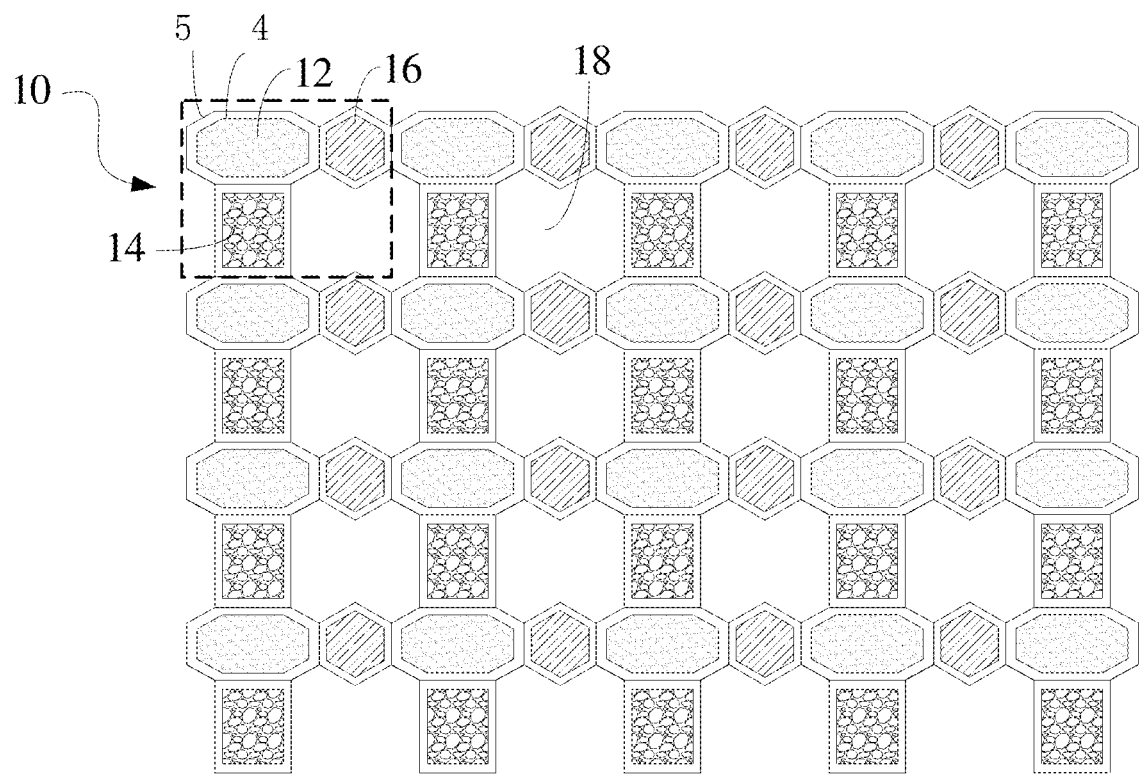
FIG. 2 is a schematic view of a pixel structure in an embodiment of the present application.
Figure 3:
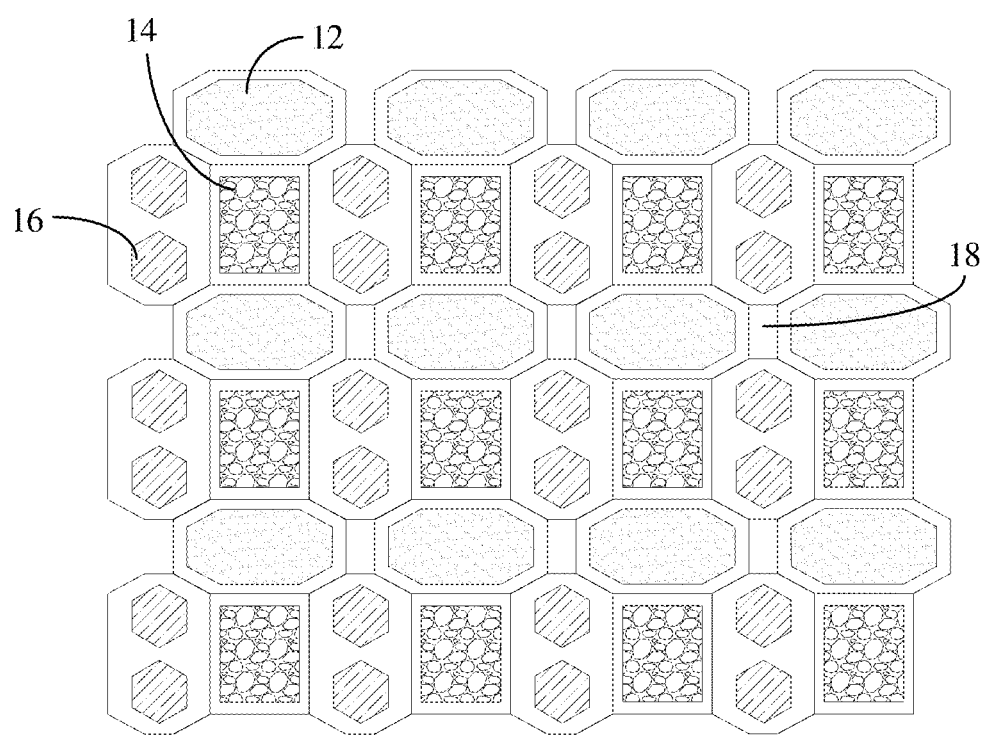
FIG. 3 is a schematic view of a pixel structure in another embodiment of the present application.

In the present application, a row direction refers to a lateral direction or a horizontal direction shown in FIGS. 2 and 3, and a column direction refers to a longitudinal direction or a vertical direction shown in FIGS. 2 and 3.

Referring to FIG. 2, in an embodiment of the present application, a pixel structure includes a plurality of repetitively arranged repeating units 10. Each of the repeating units 10 includes a first sub-pixel 12, a second sub-pixel 14, and a third sub-pixel 16 which respectively have different colors. Specifically, emitted light colors of the first sub-pixel 12, the second sub-pixel 14, and the third sub-pixel 16 are different from each other. In an embodiment, the colors of the first sub-pixel 12, the second sub-pixel 14, and the third sub-pixel 16 can be red, blue, and green, respectively. In some embodiments, the first sub-pixel 12, the second sub-pixel 14, or the third sub-pixel 16 can be in a color other than red, blue, and green, and is not limited herein.

The virtual edges 5 of two adjacent sub-pixels in the same color of adjacent repeating units 10 are spaced apart from each other and form a transmitting region 18. That is, the transmitting region 18 is located between the two adjacent sub-pixels in the same color to pass the external lights through the transmitting region 18 to increase the light transmittance of the pixel structure, and increase the amount of lights received by the photosensitive device (such as the fingerprint identification device), thereby increasing the identification accuracy of the photosensitive device and the imaging efficiency.

In some embodiments, the pixel defining layer includes a first region corresponding to the transmitting region 18 and having a first light transmittance and a second region corresponding to the sub-pixels outside the transmitting region 18 and having a second light transmittance. The first light transmittance is greater than the second light transmittance. The pixel edge 4 of each sub-pixel refers to a boundary of a pixel defining opening of the pixel defining layer, and the virtual edge 5 refers to a boundary of the first region, which corresponds to the transmitting region 18 and has the first light transmittance, of the pixel defining layer. In some embodiments, the first region having the first light transmittance of the pixel definition layer can be a thickness-reduced region or a transparent region, or the first region can be replaced with a cavity. In some embodiments, the second region having the second light transmittance of the pixel defining layer corresponds to the sub-pixels.

In some embodiments, the first sub-pixel 12, the second sub-pixel 14, and the third sub-pixel 16 are all polygonal structures. At least two of the first sub-pixel 12, the second sub-pixel 14, and the third sub-pixel 16 have different numbers of edges. In some embodiments, the first sub-pixel 12 is an octagonal structure, the second sub-pixel 14 is a quadrilateral structure, and the third sub-pixel 16 is a hexagonal structure. In some other embodiments, the first sub-pixel 12 is an octagonal structure, the second sub-pixel 14 is a quadrangular structure, and the third sub-pixel 16 is also an octagonal structure. As the numbers of edges of at least two of the first sub-pixel 12, the second sub-pixel 14, and the third sub-pixel 16 are different, the sub-pixels can be arranged more compactly, the displaying areas of the sub-pixels can be effectively increased, the pixel aperture ratio can be increased, and more combination ways of the sub-pixels can be achieved, thereby effectively improving the display performance. In the plurality of repeating units, the distances between the centers of any two adjacent sub-pixels in the same color can be equal to each other. In an embodiment, the distances each between the centers of any two adjacent first sub-pixels 12 are equal to each other, the distances each between the centers of any two adjacent second sub-pixels 14 are equal to each other, and the distances between each the centers of any two adjacent third sub-pixels 16 are equal to each other, so that the sub-pixels are regularly arranged as a matrix, thereby effectively increasing the manufacturing accuracy of the light-emitting material pattern of the sub-pixels, and reducing the mask wrinkles generated when the mask is stretched.

The inventors of the present application have found that imprecise fingerprint imaging may occur when the photosensitive device is disposed under the display panel. The inventors have found that one reason for this problem is that, due to the irregular shapes of the transmitting regions 18, a relatively complex diffraction intensity distribution may arise when the external lights are passing through these transmitting regions 18, and thus diffraction fringes may appear. As a result, the fingerprint image generated by fingerprint identification sensors may be distorted, which affects the normal operation of the photosensitive device. When the first sub-pixel, the second sub-pixel, and the third sub-pixel are all regular polygonal structures, for example, the first sub-pixel 12 is an octagonal structure, the second sub-pixel 14 is a quadrilateral structure, and the third sub-pixel 16 is a hexagonal structure, the transmitting region 18 can be a regular polygon, for example, in an axisymmetric shape with an even number of edges, such as in a quadrilateral shape, a hexagonal shape, an octagonal shape, or a decagonal shape. In some embodiments, the quadrilateral shape can be a rectangle, a square, or the like. The above-mentioned problems can be effectively avoided by the regular polygonal transmitting region 18.

In some embodiments, two adjacent sub-pixels in different colors of each repeating unit 10 share one virtual edge 5, and two adjacent sub-pixels in different colors of adjacent repeating units 10 share another virtual edge 5. In this way, the sub-pixels are arranged more compactly, thereby facilitating increasing the PPI of the pixel structure. It should be noted that, to facilitate description, the inner edges of the polygonal shapes of the first sub-pixel 12, the second sub-pixel 14, and the third sub-pixel 16 are referred to as the pixel edges 4; the outer edges of the polygonal shapes of the first sub-pixel 12, the second sub-pixel 14, and the third sub-pixel 16 are referred to as the virtual edges 5. In an embodiment, in each sub-pixel, the distances between the pixel edges 4 and the corresponding virtual edges 5 are equal to each other. Specifically, the distances between the pixel edges 4 of the first sub-pixel 12 and the corresponding virtual edges 5 of the same first sub-pixel 12 are equal to each other; the distances between pixel edges 4 of the second sub-pixel 14 and the corresponding virtual edges 5 of the same second sub-pixels 14 are equal to each other; the distances between the pixel edges 4 of the third sub-pixel 16 and the corresponding virtual edges 5 of the same third sub-pixel 16 are equal to each other. So that the pixel structure presents a regular matrix arrangement, the same type sub-pixels can be arranged without misalignment, and the sub-pixels in same color can be arranged regularly without misalignment or offset, thereby effectively increasing the manufacturing accuracy of the light-emitting material pattern of the sub-pixels and the yield, and reducing the mask wrinkles generated when the mask is stretched.

In different embodiments, the number and shapes of the sub-pixels in each repeating unit 10 can be varied, and the arrangement of the sub-pixels in the repeating unit 10 can be varied accordingly. In an embodiment as shown in FIG. 2, each of the repeating units 10 includes one first sub-pixel 12, one second sub-pixel 14, and one third sub-pixel 16. The first sub-pixel 12 and the third sub-pixel 16 are arranged in one same row or column, and the second sub-pixel 14 is arranged in another adjacent row or column. The plurality of repeating units 10 is arranged repetitively. The transmitting region 18 is collectively defined by the two adjacent second sub-pixels 14 of the two adjacent repeating units 10 disposed in the row direction, the two adjacent third sub-pixels 16 of the two adjacent repeating units 10 disposed in the column direction, and the four first sub-pixels 12 disposed in two diagonals. The transmitting region 18 is a decagon with a dumbbell shape.

In another embodiment, referring to FIG. 3, each of the repeating units 10 includes one first sub-pixel 12, one second sub-pixel 14, and two third sub-pixels 16. In an embodiment, the color of the first sub-pixel 12 is one of red and blue, and the color of the second sub-pixel 14 is the other one of red and blue, and the color of the third sub-pixel 16 can be green. The light-emitting materials of the sub-pixels in different colors have different light-emitting efficiencies. Since green lights have the highest light-emitting efficiency and the largest brightness in the three colors, each of the repeating units 10 can include two green sub-pixels with relatively small light-emitting areas, so that the two green (G) sub-pixels can share one red (R) sub-pixel and one blue (B) sub-pixel to achieve more combination ways of the sub-pixels and increase a virtual resolution of the display panel, thereby improving the display performance.

The light-emitting efficiency of the light-emitting material of the B sub-pixel is lower than that of the light-emitting materials of the R sub-pixel and the G sub-pixel. After the display panel is used for a long time, the blue light-emitting material decays faster than the red light-emitting material and the green light-emitting material, resulting in a shortened service life of the display panel. Increasing the light-emitting area of the B sub-pixel can extend the service life of the blue light-emitting material. Therefore, in an embodiment, the light-emitting area of the B sub-pixel is respectively larger than the light-emitting areas of the R sub-pixel and the G sub-pixel.

In an embodiment of the pixel structure, any two sub-pixels in different colors of each repeating unit 10 are adjacent to each other, and the two adjacent sub-pixels in different colors share one virtual edge 5. In some embodiments, as shown in FIG. 3, in each repeating unit 10, the first sub-pixel 12 is arranged in one row or column of the pixel structure, the second sub-pixel 14 is arranged in an adjacent row or column of the pixel structure relative to the first sub-pixel, and the two third sub-pixels 16 are arranged in another adjacent column or row relative to the first sub-pixel 12 or the second sub-pixel 14. The two adjacent first sub-pixels 12 in two adjacent repeating units 10 disposed in the row direction are spaced apart from each other. The two adjacent third sub-pixels 16 in two adjacent repeating units 10 disposed in the column direction are spaced apart from each other. The transmitting region 18 is disposed between the two spaced first sub-pixels 12 and between the two spaced third sub-pixels 16. The transmitting region 18 can be in a rectangular shape.

In an embodiment, each of the third sub-pixels 16 (such as the G sub-pixels) can be shared by the first sub-pixels 12 (such as the B sub-pixels) and the second sub-pixels 14 (such as the R sub-pixels) in two adjacent repeating units 10, so that more combination ways of the sub-pixels can be achieved, and the virtual resolution of the display panel can be improved. In an embodiment, the two adjacent third sub-pixels 16 in the same repeating unit 10 can share one opening of the mask plate, and, therefore, the pixel units with relatively small sizes can be manufactured while satisfying processing requirements, thereby increasing the PPI and the resolution of the display panel. The plurality of repeating units 10 can be arranged as a matrix, wherein the third sub-pixels 16 can be arranged solely in columns or rows. The centers of the third sub-pixels 16 in the same column or row can be disposed in a straight line, and the circuit lines connected to respective sub-pixels can also be in one column or one row, thereby facilitating the arrangement of the circuit lines, reducing the distance between the anode through-hole and the pixel defining layer, reducing the manufacturing difficulty of the display panel, and facilitating the manufacturing of the high-resolution display panel.

Generally, the green lights and blue lights have relatively short wavelengths, so that they have better straightness and higher propagation accuracy, and are the effective lights received by the photosensitive device. In an embodiment, as shown in FIG. 3, since each transmitting region 18 is surrounded by two green sub-pixels and two blue sub-pixels, it is easy for the transmitting region 18 to transmit blue lights and green lights to the photosensitive device to improve the identification accuracy of the photosensitive device.

In some embodiments, in each of the repeating units 10, a central line connecting centers of the first sub-pixel 12 and the second sub-pixel 14 passes through a midpoint of the shared virtual edge 5 therebetween. The two third sub-pixels 16 in each of the repeating units 10 are arranged on the same side of the central line. In this way, the sub-pixels can be arranged more uniformly, so that the finally achieved pixel structure presents a regular matrix arrangement, thereby improving the display performance. The two third sub-pixels 16 in each repeating unit 10 are arranged in the same column or row and share a common virtual edge 5. The common virtual edge 5 is a boundary of both of the two third sub-pixels 16.

In some embodiments, in the row direction or the column direction, in the adjacent repeating units, the distances between the centers of any two of the adjacent sub-pixels in the same color are equal to each other. Specifically, in an embodiment as shown in FIG. 3, in the row direction, the distances between the centers of the two adjacent first sub-pixels 12 are equal to each other, the distances each between the centers of the two adjacent second sub-pixels 14 are equal to each other, and the distances each between the centers of the two third sub-pixels 16 which are respectively in the two adjacent repeating units 10 and located in the same row are equal to each other. In the column direction, the distances each between the centers of the two corresponding third sub-pixels 16 which are respectively in the two adjacent repeating units 10 are equal to each other, the distances each between the centers of the two first sub-pixels 12 in the two adjacent repeating units 10 are equal to each other, and the distances each between the centers of the two second sub-pixel 14 in the two adjacent repeating units 10 are equal to each other. In this way, not only the sub-pixels are arranged more uniformly, but also the shapes and sizes of the transmitting regions 18 are uniform, thereby improving the uniformity of light transmission, improving the identification accuracy of the photosensitive device, and improving the imaging efficiency.

Figure 4:
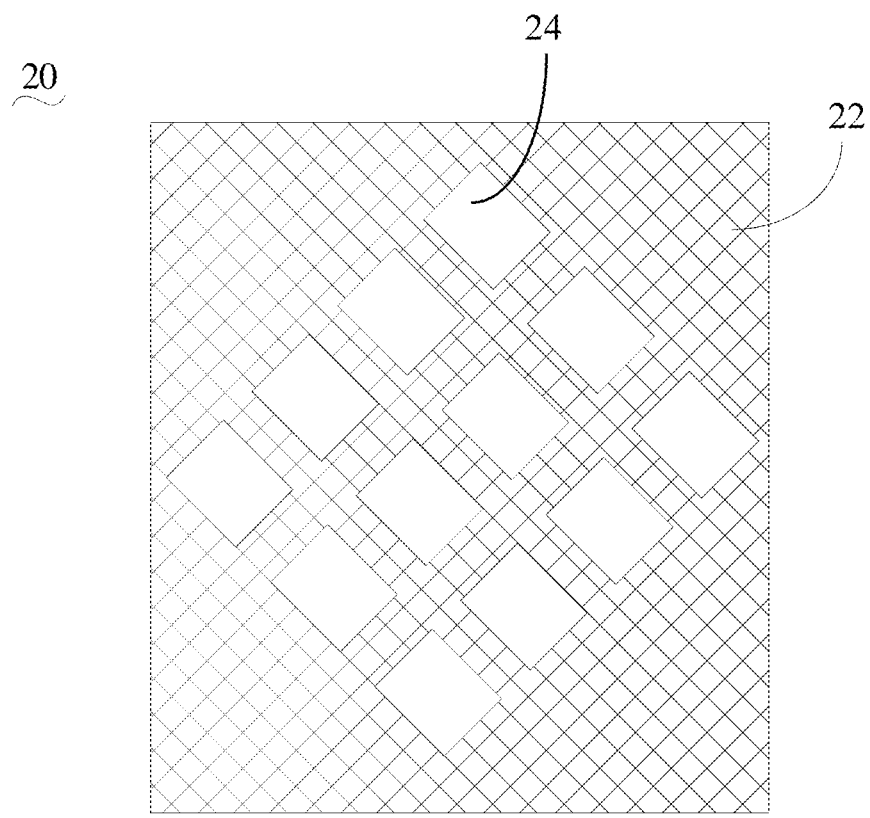
FIG. 4 is a schematic structural view of a mask plate, corresponding to the pixel structure of FIG. 3, used in an evaporation formation of a first sub-pixel and a third sub-pixel.
Figure 5:
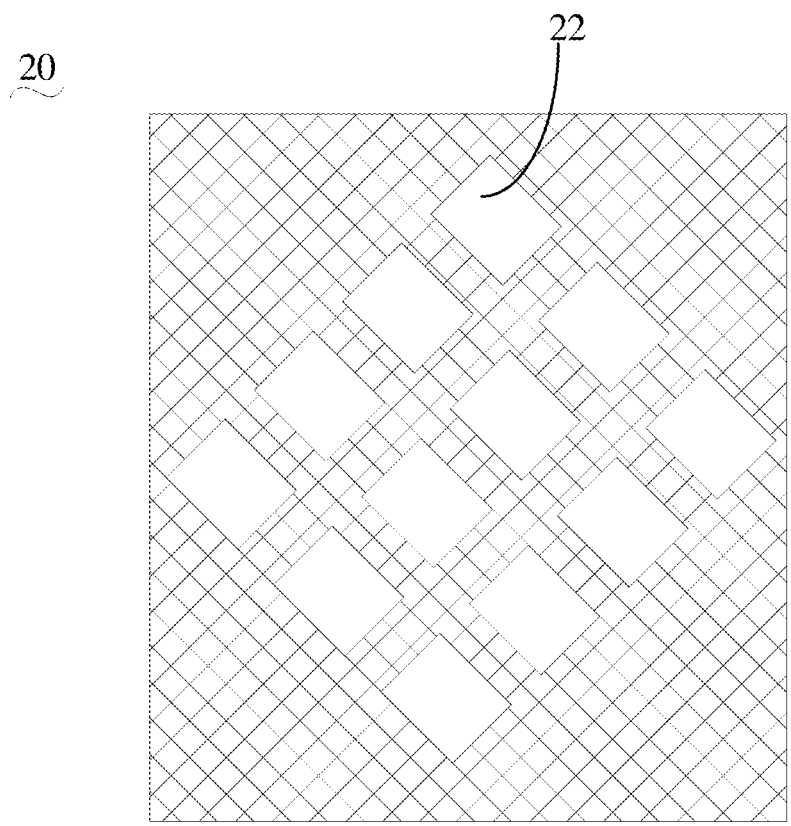
FIG. 5 is a schematic structural view of a mask plate, corresponding to the pixel structure of FIG. 3, used in an evaporation formation of a second sub-pixel.

Referring to FIGS. 4 and 5, an embodiment of the present application provides mask plates 20. The mask plates 20 are fine metal mask (FMM) plates 20 and each includes a shielding region 22 and a plurality of mask openings 24. The shielding region 22 between two adjacent mask openings 24 is referred to as a connection bridge. The mask openings 24 respectively correspond to the sub-pixels in the same color (such as the green color). Since the first sub-pixel 12, the second sub-pixel 14, and the third sub-pixel 16 are polygons having different number of edges, each mask opening is in a polygonal shape.

Specifically, in the embodiment shown in FIG. 3, the first sub-pixel 12 is an octagonal structure, the second sub-pixel 14 is a quadrilateral structure, and the third sub-pixel 16 is a hexagonal structure. The first sub-pixel 12 and the third sub-pixel 16 can be manufactured by offsetting the same mask plate 20. In one mask plate 20, each mask opening 24 which is used to evaporative-deposit the first sub-pixel 12 and the two third sub-pixels 16 is in an octagonal shape (as shown in FIG. 4). In another mask plate 20, the mask opening 24 which is used to evaporative-deposit the second sub-pixel 14 is in a quadrangular shape (as shown in FIG. 5). By setting reasonable pixel spacing, the first sub-pixels 12 and the third sub-pixels 16 can be evaporative-deposited by the same mask plate 20, thereby saving the cost and reducing the affect on the evaporative deposition quality due to the problems such as FMM curving and fracture caused by using multiple mask plates.

In some embodiments, the plurality of mask openings 24 are repetitively arranged. Each of the mask openings 24 is in an axisymmetric shape. A first angle α is formed between a symmetry axis of each of the mask openings 24 and the row direction or the column direction, where 30°<α<60°. In this way, there is a certain angle between the symmetry axis of each of the mask openings 24 and a stretching direction of the mask plate, which facilitates the dispersion of stretching force during the mask stretching, thereby improving the stability of the mask plate 20, and increasing the evaporative deposition accuracy. In an embodiment, the first angle α is 45°, which can further improve the evaporate-deposition accuracy.

Figure 6:
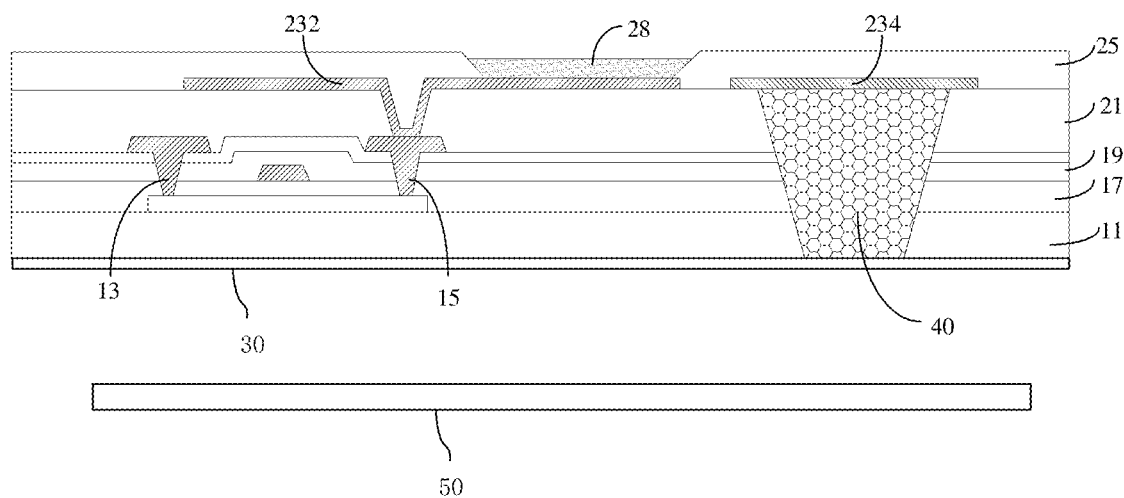
FIG. 6 is a schematic cross-sectional view of a display panel in an embodiment of the present application.

Referring to FIG. 6, the present application also provides an embodiment of a display panel on the basis of the above-mentioned pixel structure. The display panel includes a substrate 30, a photosensitive device 50, and the pixel structure as described in the above-mentioned embodiments. The pixel structure and the photosensitive device 50 are disposed on two sides of the substrate 30. The display panel has a relatively high light transmittance, so that the photosensitive device 50 can receive lights easily, thereby increasing the fingerprint identification accuracy of the display panel.

In the present embodiment, the photosensitive device 50 can include a plurality of fingerprint identification sensors. Specifically, the fingerprint identification sensors are photosensitive fingerprint identification sensors. The plurality of fingerprint identification sensors can be arranged in an array at one side of the substrate. When a finger touches the surface of the display panel, the lights reflected from the finger enter the fingerprint identification sensors, so that the fingerprint of the finger is recognized. The fingerprint identification sensors correspondingly send signals to a control unit. The control unit can control the pixel structure to display corresponding to operations, such as an unlocking operation, a payment operation, and the like.

In some embodiments of the present application, the pixel structure includes a plurality of light-emitting layers 28 and an electrode layer. The electrode layer includes a dummy transmitting electrode 234 disposed in the transmitting region 18. Specifically, each of the sub-pixels includes a light-emitting layer 28. The light-emitting layer 28 can include an organic light-emitting layer. The light-emitting layer 28 can further include a hole-injection layer, a hole-transport layer, an electron-transport layer, an electron-injection layer, and the like. In some embodiments, the electrode layer can include a plurality of anodes 232. Each of the anodes 232 can correspond to one sub-pixel. The anode 232 and a cathode can control the light-emitting layer 28 to emit lights, and the cathode layer is disposed on the surface of the light-emitting layer 28. In the transmitting region 18, the dummy transmitting electrode 234 can be disposed in the same layer with the anodes 232. The dummy transmitting electrode 234 can be without an electrical conducting function. For example, in order to improve the light transmittance of the transmitting region 18, metal material of the anode 232 can be replaced by a material having higher light transmittance, thereby forming the dummy transmitting electrode 234. The thickness of the pixel defining layer 25 in the transmitting region 18 can be reduced, and the light transmittance of the dummy transmitting electrode 234 is higher than that of the other films and layers. Therefore, the light transmittance of the transmitting region 18 can be further increased. In an embodiment, the pixel defining layer 25 can be provided with a through-hole in the transmitting region 18 to at least partially expose the transmitting electrode 234, so that the light transmittance of the transmitting region 18 can be further improved.

In some embodiments, the electrode layer includes at least one hollowed pattern corresponding to the pixel defining layer 25. In this way, the light transmittance of the display panel is further improved, and the under-screen fingerprint identification effect and accuracy can be improved. The light-emitting layer 28 lacks light transmittance or is opaque. The pixel defining layer 25 can be made of a high-transparent material, and the hollowed pattern corresponds to the pixel defining layer 25, so that the light transmittance of the display panel can be improved.

In some embodiments, at least the part of the cathode layer corresponding to the transmitting region 18 is hollowed-out or made of a transmitting material. In this way, the light transmittance of the display panel can be further improved. In some other embodiments, the dummy transmitting electrode 234 disposed in the same layer with the anode 232 can be replaced with a hollow space, therefore the light transmittance of the display panel can be further improved.

In some embodiments of the present application, the display panel further includes a driving layer group. The driving layer group is provided with a transmitting through-hole which is correspondingly disposed in the transmitting region 18. The transmitting through-hole is filled with a transparent material 40. Specifically, the driving layer group is disposed on the substrate 11 and includes a plurality of thin film transistors. The transmitting through-hole is located between adjacent thin film transistors. By filling the transmitting through-hole with the transparent material 40, on the one hand, the reduction in the strength of the films or layers due to the opening can be avoided, on the other hand, the paths of the lights reflected from the fingerprint to the photosensitive device can be increased, so that the light transmittance of the pixel structure can be improved.

Optionally, the driving layer group can include a semiconductor layer, a gate electrode, a source electrode 13, and a drain electrode 15. The semiconductor layer can be an amorphous silicon layer, a metal oxide layer, or a polysilicon layer. Alternatively, the semiconductor layer can be made of an organic semiconductor material. Optionally, the semiconductor layer includes a channel region, a source region, and a drain region, and the source and drain regions are doped with dopants. The semiconductor layer can be covered by a gate insulation layer 17, and the gate electrode can be disposed on the gate insulation layer 17. Optionally, the gate insulation layer 17 can cover the entire surface of the flexible substrate 11. Alternatively, gate insulation layer 17 can be formed by patterning. The gate insulation layer 17 can be made of silicon oxide, silicon nitride, or other insulating organic or inorganic materials in consideration of adhesion to an adjacent layer, the formability of a target layer stacked thereon, and the surface smoothness. The gate electrode can be covered by an insulating interlayer 19 made of silicon oxide, silicon nitride, and/or other suitable insulating organic or inorganic materials. A part of the gate insulation layer 17 and a part of the interlayer insulation layer 19 can be removed to form contact holes, thereby exposing predetermined regions of the semiconductor layer. The source electrode 13 and the drain electrode 15 can be in contact with the semiconductor layer through the contact holes. Since the driving layer group has a complex layer-structure, the top surface thereof may be uneven. The display panel can further include a planarization layer 21 to form a sufficiently flat top surface. After the planarization layer 21 is formed, a through-hole can be formed in the planarization layer 21 to expose the source electrode 13 or the drain electrode 15 of the driving layer group. The electrode layer is formed on the planarization layer 21. The anode 232 is in contact with the source electrode 13 or the drain electrode 15 of the driving layer group through the through-hole.

In an embodiment, each of the above-mentioned layers is made of a transparent material having a light transmittance greater than 90%, so that the light transmittance of the entire transmitting region 18 can be equal to or greater than 70%. In an embodiment, each of the films or layers is made of a material having a light transmittance greater than 95%, so that the light transmittance of the transmitting region 18 is further improved, and even the light transmittance of the entire transmitting region 18 can be equal to or greater than 80%. A conductive material layer in the transmitting region 18 can be made of ITO, IZO, Ag+ITO, Ag+IZO, or the like, and an insulating material layer in the transmitting region 18 can be made of $SiO_2$, $SiN_x$, $Al_2O_3$, or the like. The pixel defining layer 25 can be made of a high-transparent material. In this way, the light transmittance of the transmitting region 18 can be further improved.

It can be understood that the thin film transistor is known to those skilled in the art, and therefore, its specific structure and principle are not described herein.

On the basis of the same concept, the present application also provides an embodiment of a display device, which includes the above-mentioned display panel.

Specifically, the display device can be applied to the field of mobile phone terminals, bionic electronics, electronic skin, wearable devices, vehicle-mounted devices, Internet of Things devices, artificial intelligence devices, and the like. For example, the display device can be a digital device such as a mobile phone, a tablet, a palmtop computer, an iPod®, or a smartwatch.

The technical features of the above-mentioned embodiments can be arbitrarily combined. In order to make the description simple, not all possible combinations of the technical features are described in the above embodiments. However, as long as there is no contradiction in the combination of these technical features, the combinations should be in the scope of the present application.

What described above are only several implementations of the present application, and these embodiments are specific and detailed, but not intended to limit the scope of the present application. It should be understood by the skilled in the art that various modifications and improvements can be made without departing from the conception of the present application, and all fall within the protection scope of the present application. Therefore, the patent protection scope of the present application is defined by the appended claims.

What is claimed is:

1. A pixel structure, comprising:
a plurality of repeating units arranged repetitively,
wherein each of the repeating units comprises a first sub-pixel, a second sub-pixel and a third sub-pixel in different colors;
virtual edges of two adjacent sub-pixels in same color of adjacent repeating units are spaced apart from each other and form a transmitting region; and
wherein
the transmitting region is collectively defined by two adjacent second sub-pixels of two adjacent repeating units disposed in a row direction, two adjacent third sub-pixels of two adjacent repeating units disposed in a column direction, and four first sub-pixels disposed in two diagonals; or
the transmitting region is collectively defined by two adjacent first sub-pixels of two adjacent repeating units disposed in a row direction and two adjacent third sub-pixels of two adjacent repeating units disposed in a column direction.

2. The pixel structure according to claim 1, wherein the first sub-pixel, the second sub-pixel, and the third sub-pixel are all polygonal structures, and at least two of the first sub-pixel, the second sub-pixel, and the third sub-pixel have different numbers of edges.

3. The pixel structure according to claim 1, wherein two adjacent sub-pixels in different colors of each of the repeating units share one virtual edge and two adjacent sub-pixels in different colors of adjacent repeating units share another virtual edge.

4. The pixel structure according to claim 3, wherein distances between pixel edges and corresponding virtual edges are equal to each other in each sub-pixel.

5. The pixel structure according to claim 3, wherein each of the repeating units comprises one first sub-pixel, one second sub-pixel and two third sub-pixels; and
in each of the repeating units, the first sub-pixel is arranged in one row or column of the pixel structure, the second sub-pixel is arranged in an adjacent row or column of the pixel structure relative to the first sub-pixel, and the two third sub-pixels are arranged in another adjacent column or row relative to the first sub-pixel or the second sub-pixel.

6. The pixel structure according to claim 5, wherein the first sub-pixel is an octagonal structure, the second sub-pixel is a quadrilateral structure, and the third sub-pixel is a hexagonal structure.

7. The pixel structure according to claim 3, wherein each of the repeating units comprises one first sub-pixel, one second sub-pixel, and two third sub-pixels; and
in each of the repeating units, a central line connecting centers of the first sub-pixel and the second sub-pixel passes through a midpoint of the common virtual edge therebetween, and the two third sub-pixels are located on a same side of the central line.

8. The pixel structure according to claim 1, wherein distances between centers of adjacent sub-pixels in same color of adjacent repeating units are equal.

9. The pixel structure according to claim 1, wherein the transmitting region is in an axisymmetric shape and has an even number of edges.

10. The pixel structure according to claim 1, further comprising a pixel defining layer;
wherein the pixel defining layer comprises a first region corresponding to the transmitting region and having a first light transmittance and a second region corresponding to the sub-pixels outside the transmitting region and having a second light transmittance, the first light transmittance is greater than the second light transmittance, and the virtual edges are a boundary of the first region.

11. The pixel structure according to claim 10, wherein the first region is a thickness-reduced region or a transparent region, or the first region is replaced with a cavity.

12. The pixel structure according to claim 1, wherein color of the first sub-pixel is one of red and blue, and color of the second sub-pixel is the other one of red and blue, and the third sub-pixel is in green.

13. A mask plate, used in manufacturing the pixel structure according to claim 1, wherein the mask plate comprises a plurality of mask openings, and each of the mask openings is in a polygonal shape.

14. The mask plate according to claim 13, wherein each of the repeating units comprises one first sub-pixel, one second sub-pixel, and two third sub-pixels; the first sub-pixel is an octagonal structure, the second sub-pixel is a quadrilateral structure, and each of the third sub-pixels is a hexagonal structure; and the each of the mask openings is in a quadrangular shape or an octagonal shape.

15. The mask plate according to claim 13, wherein the plurality of mask openings are arranged repetitively, each of the mask openings is in an axisymmetric shape, and a first angle α is formed between a symmetry axis of each of the mask openings and a row direction or a column direction, wherein 30°<~<60°.

16. A display panel, comprising:
a substrate;
a photosensitive device; and
a pixel structure comprising a plurality of repeating units arranged repetitively,
wherein each of the repeating units comprises a first sub-pixel, a second sub-pixel and a third sub-pixel in different colors;
wherein virtual edges of two adjacent sub-pixels in same color of adjacent repeating units are spaced apart from each other and form a transmitting region;
wherein the pixel structure and the photosensitive device are disposed on two opposite sides of the substrate; and
wherein
the transmitting region is collectively defined by two adjacent second sub-pixels of two adjacent repeating units disposed in a row direction, two adjacent third sub-pixels of two adjacent repeating units disposed in a column direction, and four first sub-pixels disposed in two diagonals; or
the transmitting region is collectively defined by two adjacent first sub-pixels of two adjacent repeating units disposed in a row direction and two adjacent third sub-pixels of two adjacent repeating units disposed in a column direction.

17. The display panel according to claim 16, further comprising an electrode layer laminated with the pixel structure, wherein the electrode layer comprises a dummy transmitting electrode disposed in the transmitting region.

18. The display panel according to claim 17, further comprising a driving layer group provided with a through-hole, wherein the through-hole is correspondingly disposed in the transmitting region and filled with a transparent material.

19. The display panel according to claim 17, wherein the electrode layer comprises an anode, and the dummy transmitting electrode is disposed in a same layer with the anode.

20. A pixel structure, comprising:
a plurality of repeating units arranged repetitively,
wherein each of the repeating units comprises a first sub-pixel, a second sub-pixel and a third sub-pixel in different colors;
virtual edges of two adjacent sub-pixels in same color of adjacent repeating units are spaced apart from each other and form a transmitting region;
two adjacent sub-pixels in different colors of each of the repeating units share one virtual edge and two adjacent sub-pixels in different colors of adjacent repeating units share another virtual edge;
each of the repeating units comprises one first sub-pixel, one second sub-pixel, and two third sub-pixels; and
in each of the repeating units, a central line connecting centers of the first sub-pixel and the second sub-pixel passes through a midpoint of the common virtual edge therebetween, and the two third sub-pixels are located on a same sides of the central line.

* * * * *